United States Patent [19]

Keller

[11] Patent Number: 5,620,615

[45] Date of Patent: *Apr. 15, 1997

[54] METHOD OF ETCHING OR REMOVING W AND WSI$_x$ FILMS

[75] Inventor: David J. Keller, Boise, Id.

[73] Assignee: Micron Technology, Inc., Boise, Id.

[ * ] Notice: The term of this patent shall not extend beyond the expiration date of Pat. No. 5,492,597.

[21] Appl. No.: 565,524

[22] Filed: Nov. 30, 1995

Related U.S. Application Data

[63] Continuation-in-part of Ser. No. 242,230, May 13, 1994, Pat. No. 5,492,597.

[51] Int. Cl.$^6$ ..................................................... H01L 21/02
[52] U.S. Cl. ............................. 438/720; 216/72; 216/75; 216/79; 216/67; 252/79.1; 438/721; 438/905
[58] Field of Search ...................... 156/643.1, 646.1, 156/662.1, 656.1, 657.1; 216/67, 72, 75, 79; 252/79.1

[56] References Cited

U.S. PATENT DOCUMENTS

| | | | |
|---|---|---|---|
| 5,015,330 | 5/1991 | Okumura et al. | 156/643.1 |
| 5,382,316 | 1/1995 | Hill et al. | 156/657 X |
| 5,387,312 | 2/1995 | Keller et al. | 156/643 |
| 5,413,669 | 5/1995 | Fujita | 156/643.1 |
| 5,413,670 | 5/1995 | Langan et al. | 156/643.1 |
| 5,492,597 | 2/1996 | Keller | 156/643.1 |

*Primary Examiner*—T. Tung

[57] ABSTRACT

The present invention teaches a method for etching or removing a tungsten (W) film and a tungsten silicide (WSi$_x$) film during a semiconductor fabrication process, by the steps of: removing any exposed portions of the W or WSi$_x$ film by presenting an etchant chemistry comprising NF$_3$ and HeO$_2$ to these exposed portions at a temperature ranging from $-20°$ C. to $100°$ C. The etchant chemistry is also effective for dry cleaning a deposition chamber by removing previously deposited films of W or WSi$_x$.

40 Claims, 2 Drawing Sheets

ID OF ETCHING OR REMOVING W AND WSI$_x$ FILMS

CROSS-REFERENCE TO A RELATED APPLICATION

This is a continuation-in-part to U.S. patent application Ser. No. 08/242,230, filed May 13, 1994, now U.S. Pat. No. 5,492,597. Patent application Ser. No. 08/242,230 is hereby incorporated by reference as if set forth in its entirety.

FIELD OF THE INVENTION

This invention relates generally to semiconductor fabrication and in particular to a method for etching or removing tungsten (W) and tungsten silicide (WSi$_x$) films.

BACKGROUND OF THE INVENTION

In semiconductor fabrication, tungsten silicide (WSi$_x$) has developed as a leading conductive layer to be formed on a polysilicon layer for improved conductivity. Various etching chemistries have been developed to pattern the WSi$_x$/polysilicon stack to form such conductors as the digitline or wordline used in memory devices.

Memory devices have become very densely packed as the storage capability of each device has increased. In that light, it becomes important to etch substantially vertical lines within minimum feature widths. The majority of etching techniques in tightly spaced areas are accomplished by accelerating ions across a cathode sheath which are highly directional and thus make it to the bottom of tightly spaced areas much easier than neutrals that move in all directions. However, the typical etching chemistry, like SF$_6$, CF$_4$, CHF$_3$ or C$_2$F$_6$, will lose etching momentum in tight areas relative to open areas due to the deposition of sulfur or carbon in the tight areas relative to open areas. This phenomenon is known as micro-loading and is undesirable.

There are several possibilities which may cause micro-loading. One possible cause of micro-loading may be deposition due to the lack of sufficient neutrals in the tight areas to recombine with the deposited material to form volatile species that can be removed from the chamber. Another possibility may be due to ions reflecting off of the photoresist side walls that may cause more deposition matter buildup in tight areas than in open areas. Regardless of the cause for micro-loading, an etching chemistry for etching W and WSi$_x$ is needed that will minimize, if not eliminate micro-loading effects. The present invention addresses this very issue by teaching a new W and WSi$_x$ etching chemistry that does minimizes micro-loading. The present invention is also an effective chemistry for removing W or WSi$_x$ films that deposit on the walls of deposition chambers.

SUMMARY OF THE INVENTION

An embodiment of present invention teaches a method for etching a tungsten silicide (WSi$_x$) film in an enclosed chamber during a semiconductor fabrication process, the method comprising the steps of:

providing a patterned mask overlying the WSi$_x$ film thereby providing exposed portions of the WSi$_x$ film;

presenting an etchant chemistry comprising NF$_3$ and HeO$_2$ to the exposed portions of the WSi$_x$ film at a temperature ranging from −20° C. to 100° C., thereby etching away the exposed portions of the WSi$_x$ film and simultaneously etching substantially vertical sidewalls in the WSi$_x$ film.

Another embodiment of the present invention teaches a method for etching a tungsten (W) film in an enclosed chamber during a semiconductor fabrication process, the method comprising the steps of:

presenting an etchant chemistry comprising NF$_3$ and HeO$_2$ to exposed portions of the W film at a temperature ranging from −20° C. to 100° C., thereby etching away the exposed portions of the W film and simultaneously etching substantially vertical sidewalls into the W film.

Still another embodiment of the present invention teaches a method for removing a tungsten silicide (WSi$_x$) film from the walls of an enclosed deposition chamber during a semiconductor fabrication process, the method comprising the step of:

presenting an etchant chemistry comprising NF$_3$ and HeO$_2$ to the chamber at a temperature ranging from −20° C. to 100° C., thereby etching away any WSi$_x$ film formed on the chamber walls.

And still another embodiment of the present invention teaches a method for removing a tungsten (W) film from the walls of an enclosed deposition chamber during a semiconductor fabrication process, the method comprising the step of:

presenting an etchant chemistry comprising NF$_3$ and HeO$_2$ to the chamber at a temperature ranging from −20° C. to 100° C., thereby etching away any W film formed on the chamber walls.

Still another embodiment of the present invention teaches an etchant chemistry for etching tungsten (W) or tungsten silicide (WSi$_x$) films during a semiconductor fabrication process, said etchant chemistry comprising:

NF$_3$ and HeO$_2$ at a temperature ranging from −20° C. to 100° C.

Still another embodiment of the present invention teaches an etchant chemistry for cleaning tungsten (W) or tungsten silicide (WSi$_x$) films from the walls of a deposition chamber used during a semiconductor fabrication process, said etchant chemistry comprising:

NF$_3$ and HeO$_2$ at a temperature ranging from −20° C. to 100° C.

DETAILED DESCRIPTION OF THE INVENTION

The present invention, as depicted in FIGS. 1–4 demonstrates process steps integrated into a fabrication process of semiconductor device, such as for a dynamic random access memory (DRAM) or a static random access memory (SRAM). Though, the process described hereinafter, may be taken as reference to DRAM or SRAM fabrication, it is meant to serve as an example for practicing the present invention. As one skilled in the art will recognize from the detailed description that follows, the present invention may be integrated into any semiconductor fabrication process that requires and etching of conductive lines using W or WSi$_x$ films or any semiconductor fabrication process that requires removing W or WSi$_x$ films from the walls of a deposition chamber.

Figure 1:
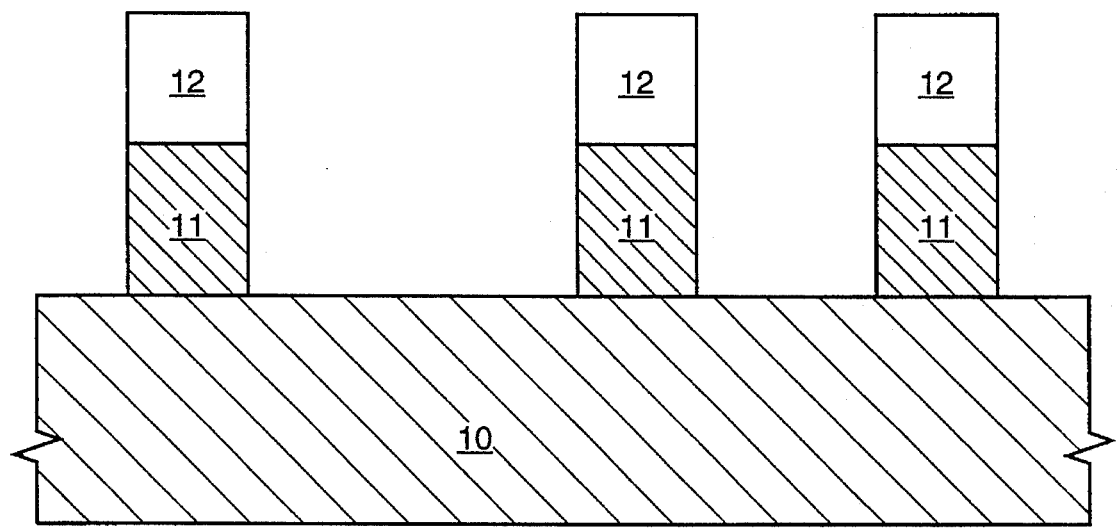
FIG. 1 is a composite cross-sectional view of a process wafer portion depicting the etching activity of the etch chemistry of the present invention on a W film or WSi$_x$ film patterned with open areas and tight areas to be removed.

Referring now to FIG. 1, a supporting substrate 10 (a silicon substrate for example) has a film 11 comprising W or WSi$_x$ formed thereover and is placed inside an enclosed etchant chamber. A patterned mask 12 overlies film 11 to provide exposed portions thereof. An etchant chemistry comprising NF$_3$ and HeO$_2$ is then presented to the exposed portions of the film 11 at a temperature ranging from −20° C. to 100° C. This etchant chemistry proceeds to etch away the exposed portions of film 11 while simultaneously etching substantially vertical sidewalls in film 11. The substantially vertical sidewalls result from the formation of an NF$_3$ plasma that creates positive ions comprising fluorine (F) and nitrogen (N) in the form of F, N and NF$_x$ that travel perpendicular to a self biased cathode of the enclosed chamber. (As a side note, this etching chemistry reduces micro-loading because all the species produced by NF$_3$ and HeO$_2$ chemistries are gases at room temperature which are volatile. Therefore, they will not build up in tightly spaced areas. Conversely, typical chemistries such as SF$_6$, CF$_4$, CHF$_3$ or C$_2$F$_6$ will produce carbon and sulfur which are solids at room temperature. These solids are non-volatile and will build up in tightly spaced areas and thus cause micro-loading.)

Figure 2:
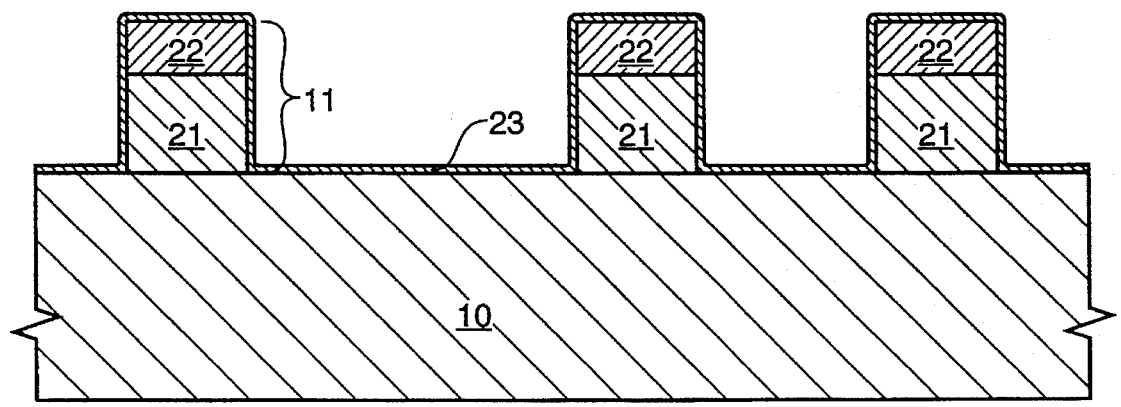
FIG. 2 is a composite cross-sectional view of a process wafer portion depicting an alternate embodiment of the present invention.

In an alternate embodiment and referring now to FIG. 2, film 11 is comprised of a W or WSi$_x$ film 22 overlying a polysilicon layer (or film) 21 to form a W/polysilicon stack or a WSi$_x$/polysilicon stack 22/21. When film 11 comprises polysilicon layer 21 lying underneath W or WSi$_x$ film 22, the polysilicon layer is then etched with the same etchant chemistry comprising NF$_3$ and HeO$_2$. In this case, the exposed portions of the W or WSi$_x$ film 22 are etched to form substantially vertical sidewalls in the W or WSi$_x$ film. If the etching is allowed to continue into the polysilicon film a W/polysilicon or WSi$_x$/polysilicon stack 21/22 having substantially vertical sidewalls is formed. The etching of stack 21/22 (or the WSi$_x$ as the case may be) is enhanced when a chlorine containing compound, an iodine containing compound or a bromine containing compound is added to the etchant chemistry etchant chemistry comprising NF$_3$ and HeO$_2$. A major reason for the etching enhancement is that when these higher order halogens (Cl, Br and I$_2$) combine with Si, passivation forms because of the low volatility of SiCl$_4$, SiBr$_4$, and SiI$_4$, relative to SiF$_4$. In turn this passivation will prevent the WSi$_x$ and the poly (which may be highly doped) from undercutting.

Also, depending on the desired use of the polysilicon film 21, this film may be doped as p-type by using a dopant concentration of boron or doped as n-type by using either a dopant concentration of phosphorus or arsenic.

Next, a dielectric film 23 is formed over W or WSi$_x$ film 22. This dielectric film may be a dielectric film such as silicon nitride or silicon dioxide.

Figure 3:
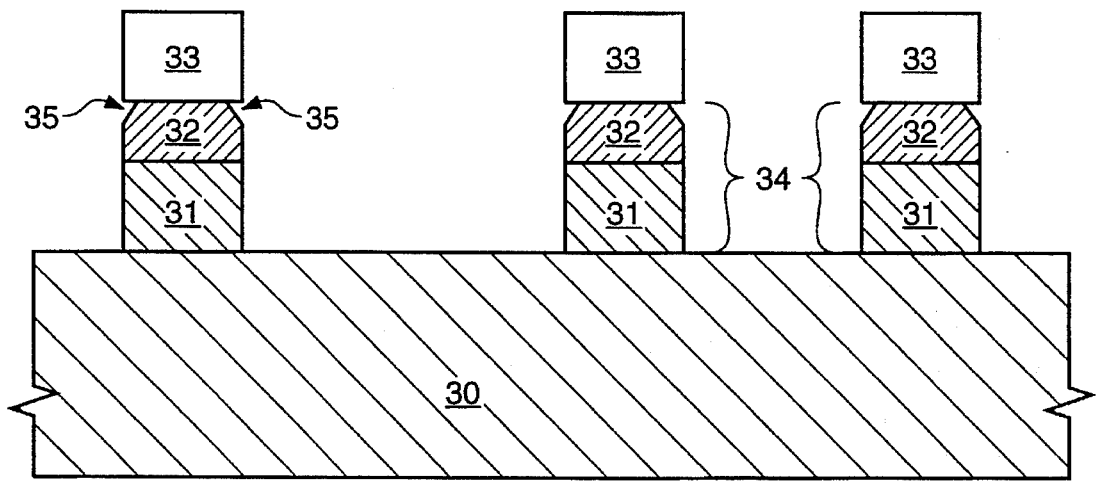
FIG. 3 is a composite cross-sectional view of a process wafer portion depicting yet another alternate embodiment of the present invention.

In another alternate embodiment and referring now to FIG. 3, film 34 is comprised of a W or WSi$_x$ film 32 overlying a polysilicon layer (or film) 31 to form a W/polysilicon stack or a WSi$_x$/polysilicon stack 31/32. First film 34 is exposed to an etchant chemistry comprising NF$_3$ and HeO$_2$ and a high order halogen, such as HBr. During this etch step it is desirable that the etchant chemistry contain approximately 75% NF$_3$, approximately 12.5% HeO$_2$ and approximately 12.5% HBr. This steps etches a substantially vertical profile into film 32. During a second etching step it is desirable that the etchant chemistry contain approximately 75% NF$_3$, approximately 12.5% HeO$_2$ and approximately 12.5% Cl$_2$ (or other lower order halogens). If so desired, this etch step may be accomplished by using approximately 85% NF$_3$ and approximately 15% HeO$_2$ alone. Both etch steps are to be performed at a temperature ranging from −20° C. to 100° C. The purpose of this second etch step is to intentionally cause undercutting (denoted by 35) into the vertical profile of film 32. Such undercutting may be desirable depending on the intended use of the resulting structure. For example, during the formation of dielectric spacers on a wordline structure for a DRAM, after the wordline structure is formed a slight undercut in the structure may be needed to produce a vertical profile after source/drain re-oxidation and prior to spacer formation.

Figure 4:
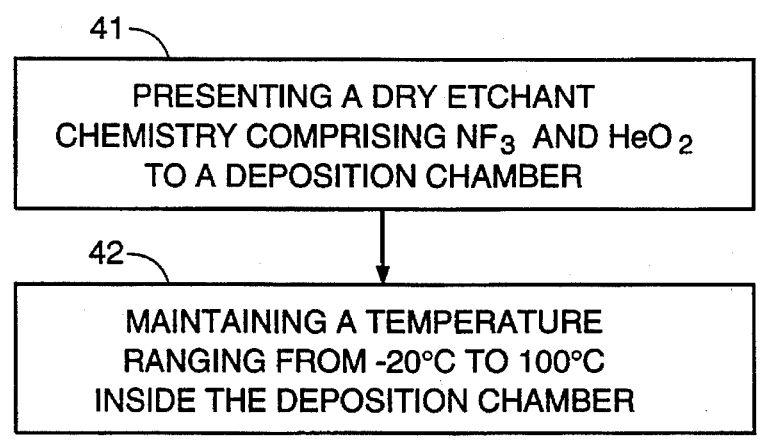
FIG. 4 depicts a process flow of yet another alternate embodiment of the present invention.

In another alternate embodiment and referring now to FIG. 4, during step 41, a dry etchant chemistry comprising approximately 85% NF$_3$ and approximately 15% HeO$_2$ is presented to a deposition chamber. During step 42, a temperature ranging from −20° C. to 100° C. is maintained inside the deposition chamber. The combination of this etchant chemistry and temperature range will effectively dry clean the deposition chamber by removing any W or WSi$_x$ film that has been deposited on the walls of the chamber during previous deposition steps. This dry cleaning method allows for effective cleaning of deposition chambers without causing extensive machine down times that is required during a wet cleaning process. The etchant chemistry of the present invention will also effectively remove other films, such as CF type polymers (that contain mostly carbon and fluorine), polysilicon and nitride.

The methods described above may be integrated into a memory device fabrication process wherein the W/polysilicon or WSi$_x$/polysilicon stack forms a wordline or a digitline (such as in a DRAM or SRAM). The methods may also be effectively integrated into a logic device fabrication process or even a microprocessor device fabrication process where a W/polysilicon or WSi$_x$/polysilicon stack or simply a patterned W or WSi$_x$ structure will be utilized.

It is to be understood that although the present invention has been described in a preferred embodiment, various modifications known to those skilled in the art may be made without departing from the invention as recited in the several claims appended hereto.

What is claimed is:

1. An etchant chemistry for etching tungsten or tungsten silicide (WSi$_x$) films during a semiconductor fabrication process, said etchant chemistry having a composition of approximately 85% NF$_3$ and approximately 15% HeO$_2$.

2. A method for etching a tungsten (W) film in an enclosed chamber during a semiconductor fabrication process, said method comprising the steps of:

presenting an etchant chemistry comprising NF$_3$ and HeO$_2$ to exposed portions of said W film at a temperature ranging from −20° C. to 100° C., thereby etching away said exposed portions of said W film and simultaneously etching substantially vertical sidewalls into said W film.

3. The method of claim 2, wherein said etchant chemistry has a composition of approximately 85% NF$_3$ and approximately 15% HeO$_2$.

4. The method as recited in claim 2, wherein said presentation of said etchant chemistry forms an NF$_3$ plasma thereby creating positive ions comprising fluorine (F) and nitrogen (N) in the form of F, N and $NF_x$ that travel perpendicularly to a self biased cathode of said enclosed chamber, thereby resulting in said substantially vertical sidewalls.

5. The method as recited in claim 2, further comprising a polysilicon layer lying underneath said W film, said polysilicon layer is etched with the same etchant chemistry comprising $NF_3$ and $HeO_2$.

6. The method of claim 5, wherein said etchant chemistry has a composition of approximately 85% $NF_3$ and approximately 15% $HeO_2$.

7. A method for etching a tungsten (W) film overlying a polysilicon film in an enclosed chamber during a semiconductor fabrication process, said method comprising the steps of:

presenting an etchant chemistry comprising $NF_3$ and $HeO_2$ to exposed portions of said W film at a temperature ranging from −20° C. to 100° C., thereby etching away said exposed portions of said W film and simultaneously etching substantially vertical sidewalls into said W film, said etching continues into said polysilicon film, thereby forming a W/polysilicon stack having substantially vertical sidewalls.

8. The method of claim 7, wherein said etchant chemistry has a composition of approximately 85% $NF_3$ and approximately 15% $HeO_2$.

9. The method as recited in claim 7, wherein said polysilicon film contains a dopant concentration comprising a dopant selected from the group consisting of phosphorus, arsenic and boron.

10. The method as recited in claim 7, wherein chlorine is added to said etchant chemistry.

11. The method as recited in claim 10, wherein said etchant chemistry has a composition of approximately 75% $NF_3$, approximately 12.5% $HeO_2$ and approximately 12.5% $Cl_2$.

12. The method as recited in claim 7, wherein a bromine containing compound is added to said etchant chemistry.

13. The method as recited in claim 12, wherein said etchant chemistry has a composition of approximately 75% $NF_3$, approximately 12.5% $HeO_2$ and approximately 12.5% HBr.

14. The method as recited in claim 7, wherein iodine ($I_2$) is added to said etchant chemistry.

15. The method as recited in claim 14, wherein said etchant chemistry has a composition of approximately 75% $NF_3$, approximately 12.5% $HeO_2$ and approximately 12.5% $I_2$.

16. The method as recited in claim 7, wherein said presentation of said etchant chemistry forms an $NF_3$ plasma thereby creating positive ions comprising fluorine (F) and nitrogen (N) in the form of N, F and $NF_x$ that travel perpendicularly to a self biased cathode of said enclosed chamber, thereby resulting in said substantially vertical sidewalls.

17. The method as recited in claim 7, wherein said semiconductor fabrication process is a logic device fabrication process.

18. The method as recited in claim 7, wherein said semiconductor fabrication process is a microprocessor device fabrication process.

19. The method as recited in claim 7, wherein said semiconductor fabrication process is a memory device fabrication process.

20. The method as recited in claim 19, wherein said memory device fabrication process is a dynamic random access memory (DRAM) device fabrication process.

21. The method as recited in claim 19, wherein said memory device fabrication process is a static random access memory (SRAM) device fabrication process.

22. The method as recited in claim 19, wherein said memory device fabrication process is a flash memory device fabrication process.

23. A method for removing a tungsten silicide ($WSi_x$) film from the walls of an enclosed deposition chamber during a semiconductor fabrication process, said method comprising the step of:

presenting an etchant chemistry comprising $NF_3$ and $HeO_2$ to said chamber at a temperature ranging from −20° C. to 100° C., thereby etching away any $WSi_x$ film formed on said chamber walls.

24. The method of claim 23, wherein said etchant chemistry has a composition of approximately 85% $NF_3$ and approximately 15% $HeO_2$.

25. The method as recited in claim 23, wherein said presentation of said etchant chemistry forms an $NF_3$ plasma thereby creating positive ions comprising fluorine (F) and nitrogen (N) in the form of F, N and $NF_x$ that travel perpendicularly to a self biased cathode of said enclosed chamber.

26. The method as recited in claim 23, wherein said semiconductor fabrication process is a logic device fabrication process.

27. The method as recited in claim 23, wherein said semiconductor fabrication process is a microprocessor device fabrication process.

28. The method as recited in claim 23, wherein said semiconductor fabrication process is a memory device fabrication process.

29. The method as recited in claim 28, wherein said memory device fabrication process is a dynamic random access memory (DRAM) device fabrication process.

30. The method as recited in claim 28, wherein said memory device fabrication process is a static random access memory (SRAM) device fabrication process.

31. The method as recited in claim 28, wherein said memory device fabrication process is a flash memory device fabrication process.

32. A method for removing a tungsten (W) film from the walls of an enclosed deposition chamber during a semiconductor fabrication process, said method comprising the step of:

presenting an etchant chemistry comprising $NF_3$ and $HeO_2$ to said chamber at a temperature ranging from −20° C. to 100° C., thereby etching away any W film formed on said chamber walls.

33. The method of claim 32, wherein said etchant chemistry has a composition of approximately 85% $NF_3$ and approximately 15% $HeO_2$.

34. The method as recited in claim 32, wherein said presentation of said etchant chemistry forms an $NF_3$ plasma thereby creating positive ions comprising fluorine (F) and nitrogen (N) in the form of F, N and $NF_x$ that travel perpendicularly to a self biased cathode of said enclosed chamber.

35. The method as recited in claim 32, wherein said semiconductor fabrication process is a logic device fabrication process.

36. The method as recited in claim 32, wherein said semiconductor fabrication process is a microprocessor device fabrication process.

37. The method as recited in claim 32, wherein said semiconductor fabrication process is a memory device fabrication process.

38. The method as recited in claim 37, wherein said memory device fabrication process is a dynamic random access memory (DRAM) device fabrication process.

39. The method as recited in claim 37, wherein said memory device fabrication process is a static random access memory (SRAM) device fabrication process.

40. The method as recited in claim 37, wherein said memory device fabrication process is a flash memory device fabrication process.

* * * * *